United States Patent
Yoshida et al.

(12)

(10) Patent No.: US 6,521,385 B2
(45) Date of Patent: Feb. 18, 2003

(54) POSITION DETECTING METHOD, POSITION DETECTING UNIT, EXPOSURE METHOD, EXPOSURE APPARATUS, AND DEVICE MANUFACTURING METHOD

(75) Inventors: Kouji Yoshida, Tokyo (JP); Yuuji Kokumai, Kawasaki (JP)

(73) Assignee: Nikon Corporation, Tokyo (JP)

( * ) Notice: Subject to any disclaimer, the term of this patent is extended or adjusted under 35 U.S.C. 154(b) by 68 days.

(21) Appl. No.: 09/735,651

(22) Filed: Dec. 14, 2000

(65) Prior Publication Data

US 2001/0007734 A1 Jul. 12, 2001

(30) Foreign Application Priority Data

Dec. 14, 1999 (JP) ............................................. 11-354138
Nov. 28, 2000 (JP) ......................................... 2000-360895

(51) Int. Cl.[7] ............................ G03F 9/00; G01B 11/00; G01J 1/00
(52) U.S. Cl. ........................ 430/22; 430/30; 250/491.1; 250/492.2; 250/492.22; 356/400
(58) Field of Search .................. 430/22, 30; 250/491.1, 250/492.2, 492.22; 356/400

(56) References Cited

U.S. PATENT DOCUMENTS 5,493,403 A    2/1996  Nishi .......................... 356/401

FOREIGN PATENT DOCUMENTS

JP          6-151274          5/1994
JP          10-300427         11/1998

*Primary Examiner*—Christopher G. Young
(74) *Attorney, Agent, or Firm*—Oblon, Spivak, McClelland, Maier & Neustadt, P.C.

(57) ABSTRACT

The imaging signal (the raw waveform) and the modified waveform are obtained, wherein the raw waveform is obtained from the image of the mark which is picked-up by the image pick-up device, and the modified waveform is obtained through the modification of the imaging signal by the waveform modifying unit. By using respective raw wave form and modified waveform, the mark information calculating unit obtains the mark information for the mark position such as estimated mark position and so forth. Then, the position calculating unit detects the positional information of the mark based on the plural mark information in the obtained mark information. As a result, the mark position might be precisely detected depending on the figure of the noise signal.

45 Claims, 9 Drawing Sheets

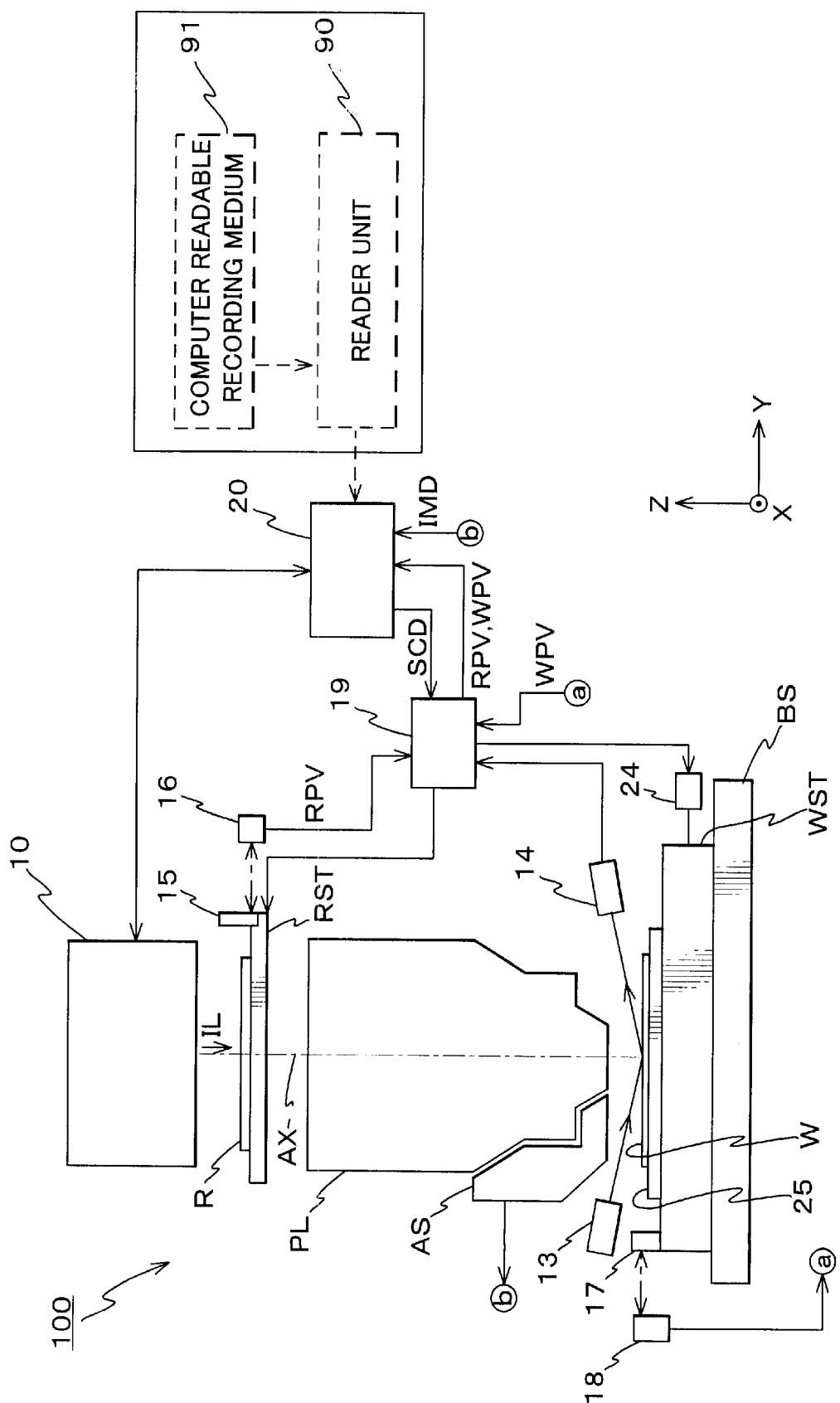

POSITION DETECTING METHOD, POSITION DETECTING UNIT, EXPOSURE METHOD, EXPOSURE APPARATUS, AND DEVICE MANUFACTURING METHOD

BACKGROUND OF THE INVENTION

Field of the Invention

The present invention relates to a position detecting method, a position detecting apparatus, an exposure method, an exposure apparatus, a computer readable recording medium and a device manufacturing method. More particularly, the present invention relates to the position detecting method and the position detecting unit for detecting positions of plural divided areas formed on an object; the exposure method and the apparatus for using the position detecting method; the computer readable recording medium in which the programs to be executed are stored; and a device manufacturing method for using the exposure method.

DESCRIPTION OF THE RELATED ART

Conventionally, in a lithographic process for manufacturing a semiconductor device, liquid crystal display device and so forth, an exposure apparatus has been used. In such an exposure apparatus, patterns formed on a mask or reticle (to be genetically referred to as a "reticle" hereinafter) are transferred through a projection optical system onto a substrate such as a wafer or a glass plate (to be referred to as a "substrate or wafer" herein after, as needed) coated with a resist or the like. As the exposure apparatus, a static exposure type projection exposure apparatus such as a so-called stepper, or a scanning exposure type one such as a so-called scanning stepper is generally used.

In these exposure apparatus, prior to exposure, the positioning of the reticle and the wafer (alignment) must be precisely performed. In order to perform the alignment, position detection marks formed in the above-mentioned lithographic process, i.e., alignment marks formed by exposure transfer, are associates to each shot area. Therefore, the position of the wafer or the circuit pattern on the wafer might be detected by detecting the alignment mark. Then, the alignment is performed by using the detection result of the position of the wafer or the circuit pattern on the wafer.

At present, several methods for position detecting of the alignment mark on the wafer is practically used. Recently, the position detecting method depends on the image detection became major. In this method, optical images of the alignment marks are picked-up by using the image pick-up unit, and the signal of the picked-up image, that is, the distribution of light intensity of the image is then analyzed to detect the positions of the alignment marks. As procedures for such waveform analysis, there is a pattern matching procedure (a template matching). In this method, the position of the alignment of which image is picked-up is set to a parameter, and the correlation between the parameter and the template waveform previously prepared is investigated in the image pick-up range for the alignment mark. Signal waveforms are analyzed by the pattern matching procedure, and the parameter value with the highest correlation between the template waveform is obtained. By using the parameter value, the position of the alignment marks is precisely detected.

The method, which is based on the template matching of the above-mentioned mark image pick-up signal (to be referred to as a "raw waveform" hereinafter, as needed) and used in the conventional method, has high tolerance to the noise having enough smaller period than the arrangement pitch of the line pattern (to be referred to as a "high frequency noise", hereinafter). For example, when the mark is structured as the line and space mark, the position detection of the mark is precisely performed by using the template matching of the raw waveform, even though the high frequency noise is superposed on the image pick-up signal. The line and space mark is composed of plural line pattern arranged in the predetermined intervals and direction. This derives from that the template matching has a averaging effect of the noise, and the effect caused by the high frequency noise is effectively deleted by the averaging effect of such noises.

However, the noise superposed on the image pick-up signal is not limited to the high frequency noise. For example, in the line and space mark, the noise which has the same degree of the arrangement frequency of the line mark or higher one (to be referred to as a "low frequency noise", hereinafter) sometimes superposed on the image pick-up signal. In this case, the effect of the noise caused by the averaging effect from the template matching of the raw waveform can not be efficiently removed. Accordingly, the position detection of the mark can not be precisely performed by using the raw waveform template matching, when the low frequency noise is superposed on the image pick-up signal.

SUMMARY OF THE INVENTION

The purpose of the present invention is to provide the position detecting methods and the apparatuses thereof for detecting the positional information of the mark formed on the object.

The another purpose of the present invention is to provide the exposure method and the exposure apparatus for transferring the predetermined pattern to the object accurately.

The yet another purpose of the present invention is to provide the computer readable recording medium in which a program for precisely detecting the positional information of the mark formed on the object is stored.

The still another purpose of the present invention is to provide the device manufacturing method for manufacturing the highly integrated device with fine patterns.

The present inventors have been studied the detection for the position detection mark consisting of line patterns and line spaces formed on the substance and used for positioning. In light of this, the following knowledge is obtained: it is important to detect the border between the line part and the space part (to be referred to as the "edge", hereinafter), at which the signal level of the imaging signal (i.e., signal intensity) is drastically changed in the position detection of the mark; and it is possible to detect the edge position by detecting the position, at which the absolute value of the rate of change in the signal waveform of the imaging signal is maximum, or the point of inflection in the signal waveform of the imaging signal. The other knowledge is also obtained: that is, the width of the edge portion is very narrow comparing to the line or space width, and the waveform of the edge portion is effected when the high frequency noises are superposed, but not affected when the low frequency noises are superposed. The present invention is completed based on the above mentioned knowledge.

In the first aspect of the present invention, the present invention is a position detecting method for detecting a positional information of a mark formed on an object comprising the steps of: performing an image pick-up of the mark; obtaining a predetermined order differential waveform of a signal waveform, which is obtained in the image pick-up; and detecting said positional information of the mark, based on a correlation between said differential waveform and a predetermined template waveform.

According to this, the imaging signal of the mark obtained is differentiated, and the predetermined order differentiated waveform of the imaging signal is obtained. The differentiated waveform is obtained by focusing on the edge, which is less effected by the low frequency noises derived from the drastically changed signal level of the imaging signal. For example, the rate of change for the signal level of the image pick-up signal (imaging signal) depending on the position is obtained as a waveform, when the predetermined differential waveform is the first order waveform. Since the waveform with the drastic change of the signal level of the imaging signal is obtained, and the waveform showing the characteristics of the edge portion is obtained. Furthermore, the rate of change for the signal level of the image pick-up signal depending on the position is obtained as a waveform, when the predetermined differential waveform is the second order waveform. Therefore, the waveform showing the characteristics of the edge portion is obtained. Still further, the waveform showing the characteristics of the edge portion is obtained, even through third or higher order differential waveform is used as the predetermined differential waveform. The positional information of the mark is detected by using the template matching of thus obtained predetermined differential waveform showing the characteristics of the edge portion.

Accordingly, the positional information of the mark is precisely detected, when the low frequency noises are superposed on the image pick-up signal of the mark and the positional information of the mark can not be detected precisely by using the template matching of the raw waveform.

In the first position detecting method of the present invention, the positional information of the mark might be obtained by using the method comprising the steps of: obtaining a correlation coefficient between said differential waveform and said template waveform at a respective relative position while the relative positional relation between the differential waveform and the template waveform is changing; and detecting said positional information of the mark based on the relative positional relation at which a correlation coefficient is maximum.

In the second aspect of the present invention, the present invention is a position detecting method for detecting a positional information of a mark formed on an object comprises the steps of: performing an image pick-up of the mark; performing a predetermined modification processing to a signal waveform which is obtained by the image pick-up to obtain at least one of a modified waveform; obtaining respective mark information with respect to a position of said mark based on the respective signal waveform and the modified waveform; and detecting said positional information of said mark based on a plurality of the mark information out of the obtained mark information.

With this, the raw waveform of the imaging signal is obtained, and at least one of the modified waveform of the imaging signal is obtained. Then, the mark information for the mark position such as estimated mark position and so forth is obtained by using the respective raw waveform and at least one of the modified waveform. The positional information of the mark is detected based on the plural mark information n the obtained mark information. Accordingly, the waveform to be used for detecting the positional information of the mark is properly selected depending on the figure of the noise signal superposed on the imaging signal, and the positional information of the mark is detected by using the selected waveform. Therefore, in spite of the figure of the noise signal, mark position might be precisely detected. In the plural waveforms to be used for detecting the positional information of the mark, the raw waveform might be included or not.

In the second position detecting method of the present invention, said modified waveform might be that having different signal intensity distribution from those of said signal waveform.

In the second position detecting method of the present invention, said predetermined modification processing might include performing to change a distribution of frequency components of said signal waveform. Alternatively, said predetermined modification processing might include obtaining at least predetermined order differential waveform of said signal waveform.

At least one of the modified waveform might be the plurality order of differential waveforms up to said predetermined order.

In the second position detecting method of the present invention, said positional information of said mark is detected by using an weighted calculating operation of the plurality of mark information, in said detection for the positional information of the mark.

Respective weight of a plurality of mark information used in said weighted calculating operation can be obtained based on the plurality of the mark information and a reference mark information previously obtained.

In the detection of the positional information of the mark, a correlation coefficient at a respective relative position might be obtained, while said relative positional relation between said signal waveform and a template waveform for the signal waveform, and the relative positional relation between at least one of desirable modified waveform and the template waveform for the modified waveform in the modified ones are changing; and respectively obtaining estimated positions of the mark might be obtained based on the relative positional relation at which the correlation coefficients are maximum, wherein the estimated positions of the mark are the mark information for signal waveform of the mark or at least one of desirable modified waveform in the modified ones.

In the position detecting method of the present invention for performing the weighted calculating operation, all of said signal waveform and modified one might be used as a waveform for position detection to obtain the positional information of said mark, in a detection of said positional information of the mark.

Weights of a plurality of said mark might be obtained based on the same number of a reference mark information as those of said waveform for position detection.

The weights of a plurality of said mark information are statistically obtained based on the larger number of a reference mark information than those of said waveform for position detection.

In the second position detecting method according to the present invention, a waveform, which is estimated that it becomes the closest mark information to said reference mark information is decided to use it as the waveform for a position detection, and said mark position might be detected based on the estimated waveform for the position detection, in detecting said positional information of said mark.

In the third aspect of the present invention, the present invention is the position detecting unit for detecting a positional information of a mark formed on an object comprises an image pick-up unit for performing an image pick-up on an area formed on the object; a differentiation operating unit, which is electrically connected to the image pick-up unit, and which obtains a predetermined order differential waveform of the mark obtained as a result of the image pick-up by the image pick-up unit; and a position operating unit, which is electrically connected to the image differentiation operation unit, and which detects the positional information of the mark, based on a correlation between the differential waveform and a predetermined template waveform.

With this, the image pick-up signal (the raw waveform) is differentiated by the differentiation operating unit to obtain the predetermined order differentiation signal. The position operating unit performs the template matching the differentiation signal obtained with the template waveform. That is, the positional information of the mark might be detected by using the first position detecting method of the present invention. Accordingly, the position of the mark formed on the substance might be detected by using the first position detecting method of the present invention. Therefore, the positional information of the mark might be detected precisely by using the method, even when the low frequency noises are superposed on the imaging signals of the mark and the position detection can not be performed precisely by using the template matching of the raw waveform.

In the first position detecting unit of the present invention, said position operating unit comprises a correlation coefficient calculating unit which obtains a correlation coefficient between said differential waveform and said template waveform at respective relative position, while relative positional relation between the differential waveform and said template waveform is changing; and a position calculating unit, which is electrically connected to the correlation coefficient calculating unit, and which calculates the positional information of the mark based on the relative positional relation at which the correlation coefficient is maximum.

In the fourth aspect of the present invention, the present invention is the second position detecting unit for detecting a positional information of a mark formed on an object comprises an image pick-up unit which performs an image pick-up on the object; a waveform modifying unit which is electrically connected to the image pick-up unit, and which performs a predetermined modification processing to a signal waveform obtained as a result of the image pick-up by the image pick-up unit to obtain a modified waveform; and a mark information calculating unit which is electrically connected to the waveform modifying unit, and which obtains respective mark information with respect to a position of the mark based on a signal waveform and the modified waveform obtained by said waveform modifying unit; and a position calculating unit, which is electrically connected to the mark information calculating unit, and which detects said positional information of said mark based on a plurality of the mark information out of the mark information obtained by the mark information calculating unit.

With this, the imaging signal (the raw waveform) and the modified waveform are obtained, wherein the raw waveform is obtained from the image of the mark which is picked-up by the image pick-up unit, and the modified waveform is obtained through the modification of the imaging signal by the waveform modifying unit. Based on respective raw waveform and modified waveform, the mark information calculating unit obtains the mark information for the mark position such as estimated mark position and so forth. Then, the position calculating unit detects the positional information of the mark based on the plural mark information in the obtained mark information. That is, the waveform to be used to detect the positional information of the mark is properly selected depending on the figure of the noise signal superposed on the imaging signal, and the positional information of the mark is detected by using the selected waveform. Accordingly, the positional information of the mark might be detected by using the second position detecting method of the present invention, in spite of the figure of the noise signal, mark position might be precisely detected.

In the second position detecting unit of the present invention, said waveform modifying unit might comprise (a) a frequency component changing unit which performs a processing to change a distribution of a frequency component of said signal waveform as said predetermined modification processing, or (b) a differentiation operating unit which obtains at least predetermined order differential waveform of said signal waveform as said predetermined modification processing.

The differentiation unit is structured so that said differentiation operating unit obtains a plurality of order differential waveform up to said predetermined order, and said position calculating unit detects said positional information of said mark by using a weighted calculating operation of a plurality of the mark information.

Said position calculating unit might comprise a weight calculating unit which obtains respective weight of a plurality of said mark information used in said weighted calculating operation based on a plurality of the mark information and a reference mark information previously obtained.

In the fifth aspect of the present invention, the present invention is an exposure method to transfer a predetermined pattern onto a divided area on a substrate comprising the steps of: detecting a position information of a mark for position detection formed on the substrate by using the position detecting method according to the present invention, and obtaining a predetermined number of parameter for said predetermined divided area, and calculating an arrangement information of the divided area formed on the substrate; and transferring the pattern onto the divided area, while the position of the substrate is regulated based on the arrangement information of the divided area.

With this, in the calculation of the arrangement information, a position detection mark formed on the substrate is detected by using the method of the present invention to calculate the arrangement coordinate of the divided area on the substrate based on the detection result. Then, in the transfer process, the pattern is transferred onto the divided area, while the positioning of the substrate is preformed based on the calculation result of the arrangement information of the divided area calculated.

In the sixth aspect of the present invention, the present invention is an exposure apparatus for transferring a predetermined pattern onto a divided area on a substrate comprising: a stage unit which moves the substrate along a movement plane; and a position detecting unit according to this invention, which detects a position information of a mark formed on the substrate, loaded on the stage unit. According to this, the position detecting unit of the present invention might precisely detect the positional information of the mark on the substrate, further the positional information of the substrate. Accordingly, a stage unit might move the substrate along a movement plane. As a result, the predetermined pattern can be transferred onto the divided area on the substrate with improved accuracy.

In the seventh aspect of the present invention, the present invention is the first computer readable recording medium containing data for a control program to be executed by a position detecting unit to detect a mark position formed on a substrate, wherein the control program comprises the procedure to obtain a predetermined order differential waveform of a signal waveform which is obtained by the image pick-up of the mark; and the procedure to detect a positional information of the mark, based on the correlation between said differential waveform and said predetermined template waveform.

With this, the position detecting unit reads out the control program contained in the computer readable medium to execute it, the mark position on the substance might be measured by using the second position detecting method of the present invention. Accordingly, the positional information of the mark might be detected precisely by using the method, even when the low frequency noises are superposed on the imaging signals of the mark and the position detection can not be performed precisely by using the template matching of the raw waveform.

In the eighth aspect of the present invention, the present invention is the second computer readable recording medium containing data for a control program to be executed by a position detecting unit to detect a mark position formed on a substrate, wherein the control program contains the procedure to perform the predetermined modification processing to a signal waveform which is obtained by said image pick-up of the mark to obtain at least one of modified waveform; the procedure to obtain the mark information of said position mark based on said signal waveform and at least one of modified waveform respectively; and the procedure to detect the positional information of the mark based on a plurality of the mark information in the mark information previously obtained.

With this, the position detecting unit reads out the control program contained in the computer readable medium to execute it, the mark position on the substance might be measured by using the second position detecting method of the present invention. Accordingly, the positional information of the mark might be detected precisely by using the method, even when the low frequency noises are superposed on the imaging signals of the mark and the position detection can not be performed precisely by using the template matching of the raw waveform.

The present invention is the device manufacturing method using the exposure methods of the present invention in the above-mentioned lithography step. According to this, since the predetermined patterns are exposed by the present exposure method to transfer precisely onto the divided area, the productivity of the highly integrated device having the fine circuit pattern might be enhanced.

BRIEF DESCRIPTION ON THE DRAWINGS

FIG. 1 is a view showing the schematic arrangement of an exposure apparatus according to an embodiment of the present invention;

DESCRIPTION OF THE PREFERRED EMBODIMENT

Figure 2A:
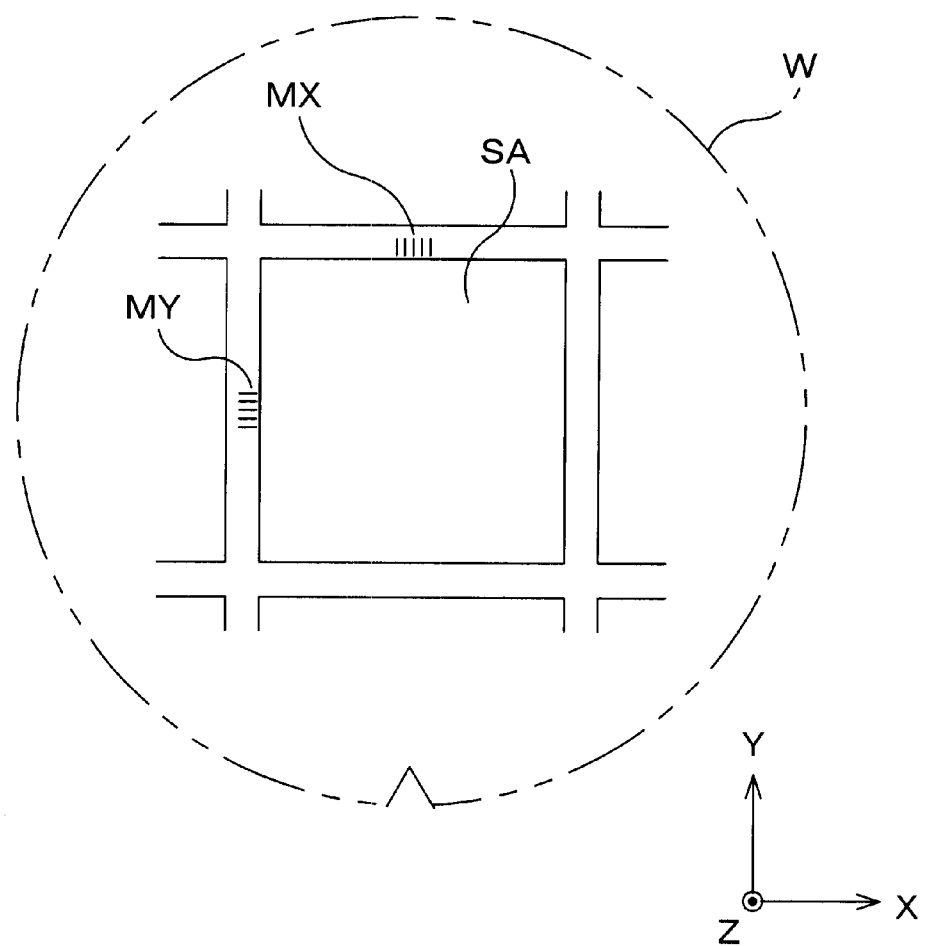
FIG. 2A and FIG. 2B are views for explaining as an example of alignment marks.

An exposure method and exposure apparatus according to an embodiment of the present invention will be described below with reference to FIGS. 1 to 9.

FIG. 1 shows the schematic arrangement of an exposure apparatus 100 according to one embodiment of the present invention. The exposure apparatus 100 is a step-and-scan type projection exposure. The exposure apparatus 100 comprises: the illumination system 10 for emitting illumination light for exposing the wafer, reticle stage RST serving as a mask stage for holding the reticle R as a mask; a projection optical system PL; the wafer stage WST for moving two-dimensionally; the wafer W (as a sample for the substrate or substance); the alignment system AS as an unit for image pick-up, and the main control system 20 for controlling the entire of the apparatus.

The illumination system 10 includes: the illumination averaging optical system composed of a fly eye lens, a relay lens, a variable ND filter, a reticle blind, and an dichroic mirror lens (all of which are not shown in Figs.). The structure of the illumination system is disclosed, for example, disclosed in the publication of Japanese unexamined patent application (refer to as "Japan laid-open", hereinafter) No. H10-112433. The disclosure described in the above is fully incorporated by reference herein. In the illumination system, the illumination light IL illuminates the illumination area with slit form defined by the reticle blind on the reticle R on which a circuit pattern is drawn.

The reticle R is fixed on the reticle stage RST, for example, by vacuum chucking. In order to position the reticle R, the reticle stage RST is driven by the reticle stage driving unit composed of two dimensional magnetic floating type linear actuator which is not shown in Figs., and structured so that it can be finely driven two-dimensionally (in the X-axis direction, the Y-axis direction perpendicular to the X-axis direction, and the rotational direction around the Z-axis perpendicular to the X-Y plane) within a plane perpendicular to an optical axis IX (coinciding with an optical axis AX of the projection optical system PL, which will be described later) of the illumination optical system. In this embodiment, since the above-mentioned two dimensional magnetic floating type linear actuator includes two driving coils for X and Y and another driving coil for Z, the reticle stage RST can be finely driven in Z direction.

The reticle laser interferometer (to be referred to as a "reticle interferometer" hereinafter) 16 detects the position of the reticle stage RST within the stage movement plane at all times by for example, a resolution of about 0.5 to 1 nm. Positional information (or velocity information) RPV of the reticle stage RST is sent from the reticle interferometer 16 to a stage control system 19. The stage control system 19 drives the reticle stage RST through a reticle driving portion (not shown in Figs.) by using the information RPV of the reticle stage RST. The information RPV of the reticle stage RST is transmitted to the main controller 20 through the stage control system 19.

The projection optical system PL is arranged below the reticle stage RST in FIG. 1. The direction of the optical axis AX (which coincides with the optical axis IX of the illumination optical system) of the projection optical system PL is the Z-axis direction. As the projection optical system PL, a refraction optical system is used, which is in double telecentric, and having a predetermined projection magnification of, for example, ⅕ or ¼. Therefore, when the illumination area of the reticle R is illuminated with the illumination light IL from the illumination optical system, a reduced image (partial inverted image) of the circuit pattern of the reticle R in the illumination area IAR is formed on the wafer W, of which surface is coated with a photo-resist.

The wafer stage WST is arranged below the projection optical system PL in FIG. 1, and on base BS. The wafer holder 25 is mounted on the wafer stage WST. The wafer W as a substrate is held on the wafer holder 25 by, for example, vacuum chucking. The wafer holder 25 is structured so that it is tilted to optional direction to the orthogonal plane of the light axis, and is finely driven to the AX direction of the light axis of the projection optical system PL (Z-direction). The wafer holder 25 is driven around the AX direction of the light axis of the projection optical system PL.

The wafer stage WST is structured to be moved in the perpendicular direction to the scanning position (X-direction) so that the wafer stage WST is also moved in the scanning direction (Y-direction) to be positioned in the exposure area which is conjugate to the above-mentioned illumination area. The wafer stage WST performs so-called step-and-scan operation motion in which the scanning exposure of the shot area on the wafer W and moving to the exposure starting position of the next shot area are repeated. The wafer stage WST is driven in the XY-two dimensional direction by using the wafer stage driving portion 24.

The wafer interferometer 18 arranged externally detects the position of the wafer W in the X-Y plane at all times with a resolution of about 0.5 to 1 nm. Positional information (or velocity information) WPV of the wafer stage WST is sent to a stage system 19. The stage control system 19 drives the wafer stage WST by using the positional information WPV of the wafer stage WST. The positional information WPV of the wafer stage WST is transmitted to the main controller 20 through the stage control system 19.

The above-mentioned alignment system AS is an off-axis alignment sensor arranged at the side of the projection optical system PL. The alignment system AS outputs the picked-up image of the alignment marks (wafer mark) associated beside each shot area on the wafer W. These image pick-up results are sent to the main controller system 20 as the image pick-up data IMD.

Figure 2B:
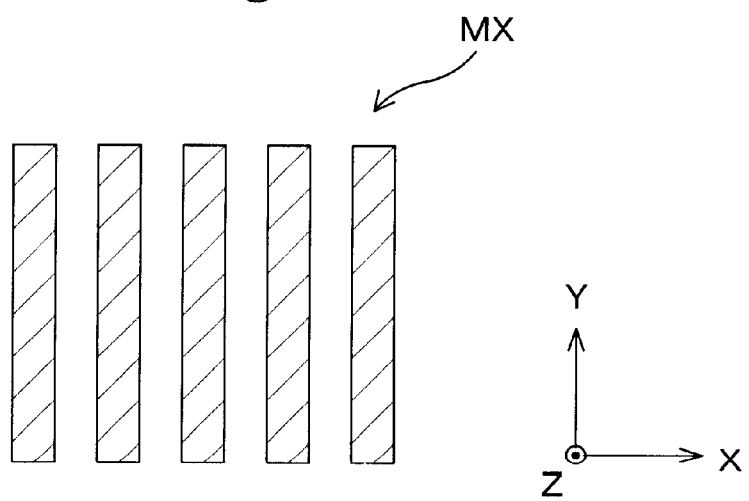

As alignment marks, for example, the mark MX and the mark MY are used. Both the marks are formed on the street line around the shot area SA on the wafer shown in FIG. 2A, and the mark MX is used for position detection in X-direction and the mark MY is used for position detection in Y-direction. As respective mark MX and MY, for example, the line and space mark might be used which has periodic structure along the direction of the position detection, as typically shown as the magnified mark MX in the FIG. 2B. The alignment system AS outputs the image pick-up data IMD as the image pick-up result to the main controller 20 (see FIG. 1). In FIG. 2B, the line and space with five lines is shown, but the line numbers in the line and space mark employed as the mark MX (or the mark MY) is not limited to five, and other numbers can be used. In the following explanation, the mark MX or MY is described as the mark MX (i, j) or the mark MY (i, j) correspond to the arrangement position of the coincide shot area, when the mark MX or MY is shown respectively.

Figure 3A:
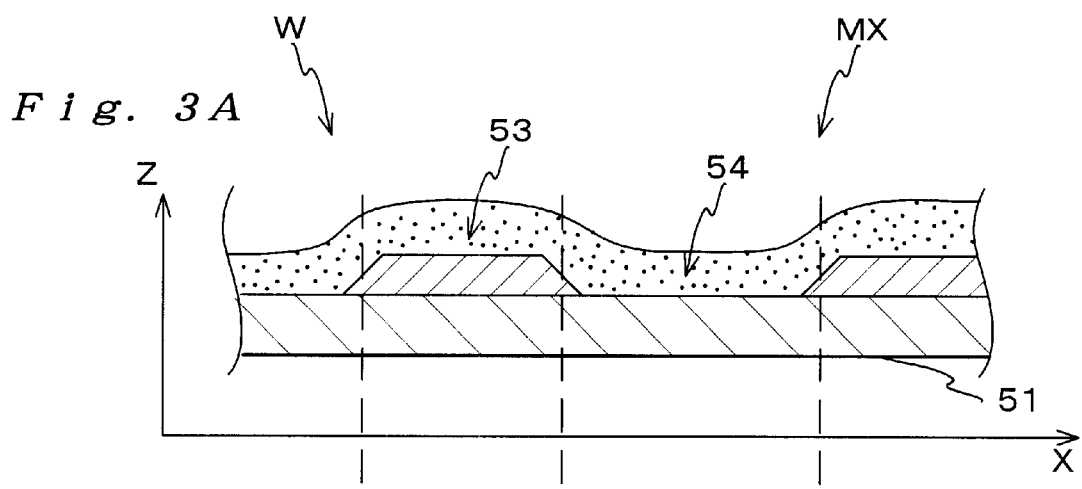
FIG. 3A to FIG. 3D are views for explaining template waveforms for the alignment mark.

In the formation area of the mark MX on the wafer, as shown in X-Z cross sectional plane in FIG. 3A, the line pattern 53 and the space pattern 54 are formed each other in X-direction, and the photoresist layer covers the line pattern 53 and the space pattern 54. The material used for the photoresist layer is, for example, the positive type photoresist material or the chemically amplified type resist, and has high optical transparency. The material used for the base layer 51 and the line pattern 53 are different, and reflection factor or transmission factor is generally different. In this embodiment, the material for the line pattern 53 has high reflection factor, and that for the base layer has higher reflection factor than that of the line pattern 53. The upper surfaces of the base layer 51, line pattern 53, and space pattern 54 are almost flat.

Figure 3B:
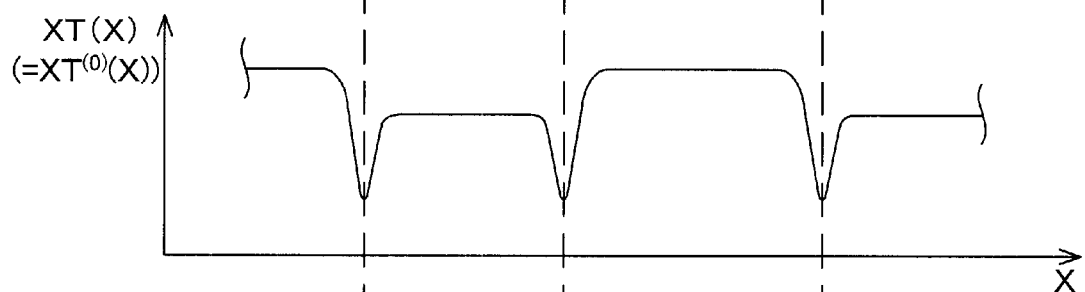
Figure 3C:
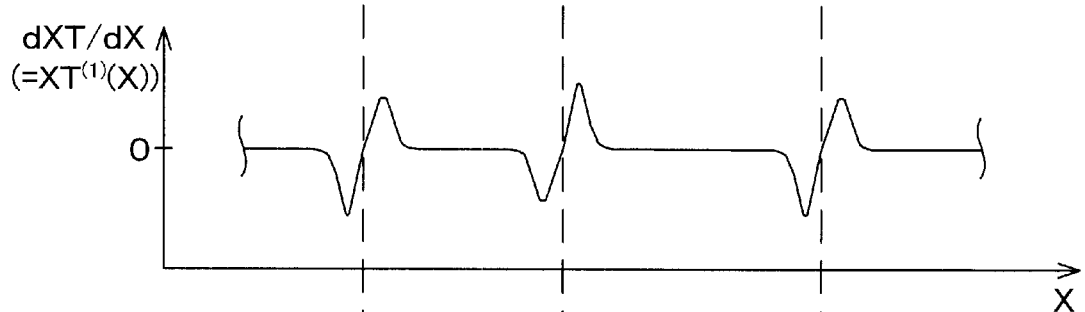
Figure 3D:
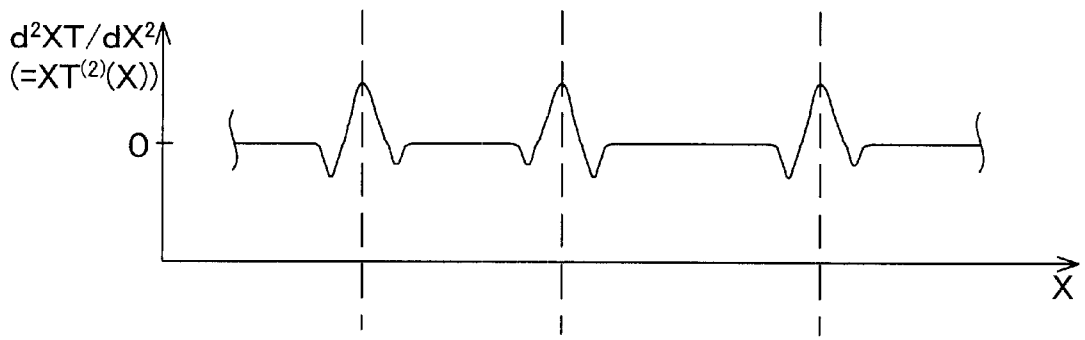

The distribution of light intensity I for the image in X-direction is that shown in FIG. 3B on its design, when the image formed by the reflection light on the formation area of the mark MX, which is illuminated by the illumination light from the upper side, is observed. That is, in the observation image, the light intensity I is the most large and stable at the coincide position with the upper surface of the base layer 51. The light intensity I is the second most large and stable at the coincide position with the upper surface of the line pattern 53. Between the upper surface of the line pattern 53 and the base layer 51, the light intensity changes so that it draw J-form (or its mirrored form) when the intensity is plotted. In the embodiment, the waveform shown in FIG. 3B is used for the template waveform XT(X) for the raw waveform. The differential waveform of the template waveform XT(X) is used as the template waveform for the differential waveform of the raw waveform. Among such template waveforms, the template waveform of the first order differential waveform $d(XT(X)/dX)$ and the template waveform of the second order differential waveform $d^2(XT(X)/dx^2)$ are shown in FIG. 3C and FIG. 3D.

The mark MY is also similarly structured, except that the arrangement direction of the line pattern and the space pattern is Y-direction.

Recently, since the circuit of the semiconductor became finer, in order to form the fine circuit pattern more precisely, the process for averaging the surface of each layer formed on the wafer W has been employed. The representative process is CMP process (chemical and mechanical polishing process) in which polishing the surface of the film formed to flatten the coating surface. CMP process is sometimes applied on the inter-layer insulating film (dielectric substances such as silicon dioxide) in the wiring layers (metal) of the semiconductor integrated circuit.

Recently, in order to insulate, for example, adjoining fine elements, Shallow Trench Isolation (STI) process is developed. In STI, the predetermined shallow trench is formed, and the insulation film such as dielectrics or the like is embedded in the trench. In STI process, the surface of the layer in which the insulation material is embedded is flattened by using CMP process, and then, the polycrystalline silicon (to be referred to as "poly-silicon" hereinafter) film is formed on the surface. For the mark MX formed through such processes, the case that other patterns are formed simultaneously is explained, referring to FIG. 4A to FIG. 4E.

First of all, the mark MX, which comprised a concave portion corresponds with the line portion 53 and a convex portion corresponds with the space portion 54, and the circuit pattern 59 (more precisely, the concave portion 59a) are formed on the silicon wafer 51.

Figure 4A:
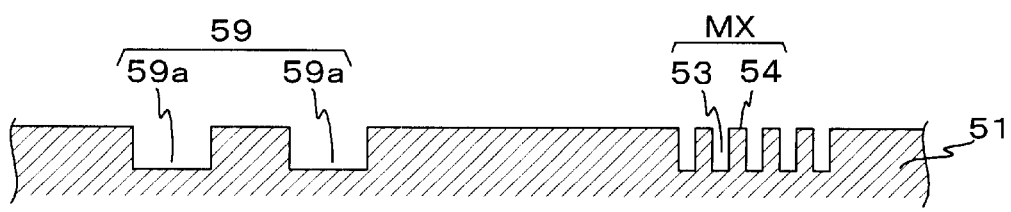
FIG. 4A to FIG. 4E are flow charts for explaining the process for forming the mark via CMP process.
Figure 4B:
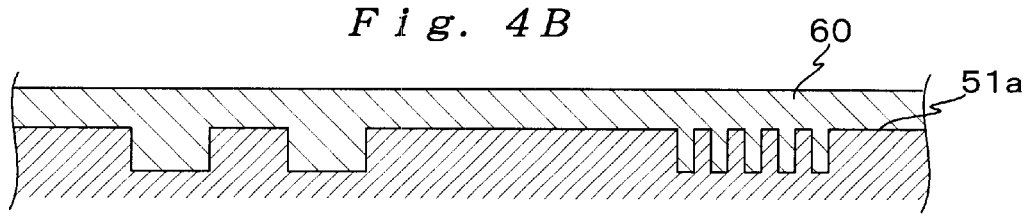
Figure 4C:
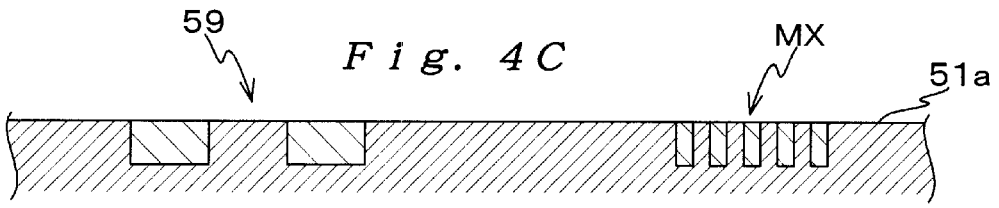

Then, as shown in FIG. 4B, the insulation film 60 which is composed of dielectric material such as silicon dioxide ($SiO_2$) and so forth is formed on the surface 51a of the wafer 51. Subsequently, as shown in FIG. 4C, CMP process is applied on the surface of the insulation film 60 to delete the film, and the surface 51a of the wafer 51 is flattened. As a result, the circuit pattern 59 is formed in the circuit pattern area, and the insulation material 60 is embedded in the concave portion 59a of the circuit area. The mark MX is formed in the mark MX area, and the insulation material 60 is embedded in the plural line portion 53.

Figure 4D:
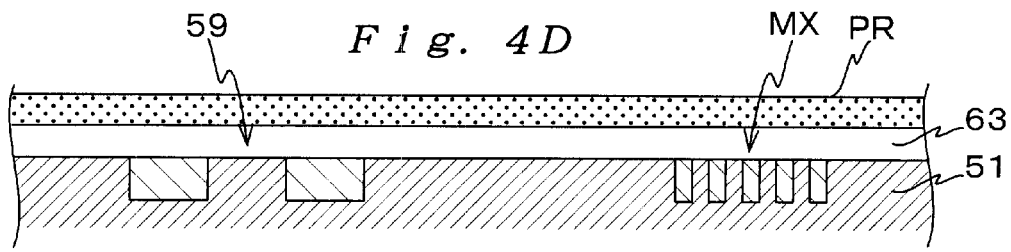

Then, as shown in FIG. 4D, the poly-silicon film is formed on the upper layer of the wafer surface 51a of the wafer. On the poly-silicon film 63, photoresist PR is coated.

The concave and convex, which reflect the structure of the mark MX formed in the under layer, is not entirely formed on the surface of the poly-silicon layer 63, when the mark MX formed on the wafer 51 as shown in the FIG. 4D by using the alignment system AS. The luminous flux with predetermined wave range, visible light of which wave length is 550 to 780 nm, does not pass through the poly-silicon layer 63. Therefore, the mark MX is not detected by using the alignment manner, which uses the visible light as the detection light. Alternatively, there is the possibility that the detection accuracy might be low in the alignment manner cased by reducing the amount of the light as the detection light for the alignment, of which major part is occupied in the visible light.

In FIG. 4D, the metal film (metal layer) 63 might be formed instead of the poly-silicon layer 63. In this case, the concave and convex which reflect the alignment mark formed in the under layer is not entirely formed on the metal layer 63. In general, since the detection light for the alignment does not pass though the metal layer, there is the possibility that the mark MX might not be detected.

As mentioned above, in order to observe the wafer 51 on which the poly-silicon layer is formed (shown in FIG. 4D) by using the alignment system AS, the mark MX might be observed, after the detection light is set to the light except the visible light (for example, the infrared rays of which wavelength is 800 to 150 nm) if the light may be changeable, selectable or optionally set.

Figure 4E:
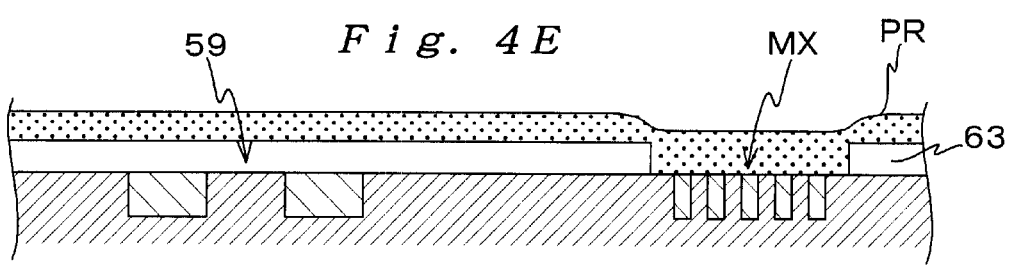

When the wavelength of the alignment detection light can not be elected or the metal layer 63 is formed on the wafer 51 passed through CMP process, as shown in FIG. 4E, the area of the metal layer 63 correspond with that the mark MX is peeled off by using photolithography and then the area is observed by the alignment system.

The mark MY is formed in the same manner as the above-mentioned mark MX via CMP process.

Figure 5:
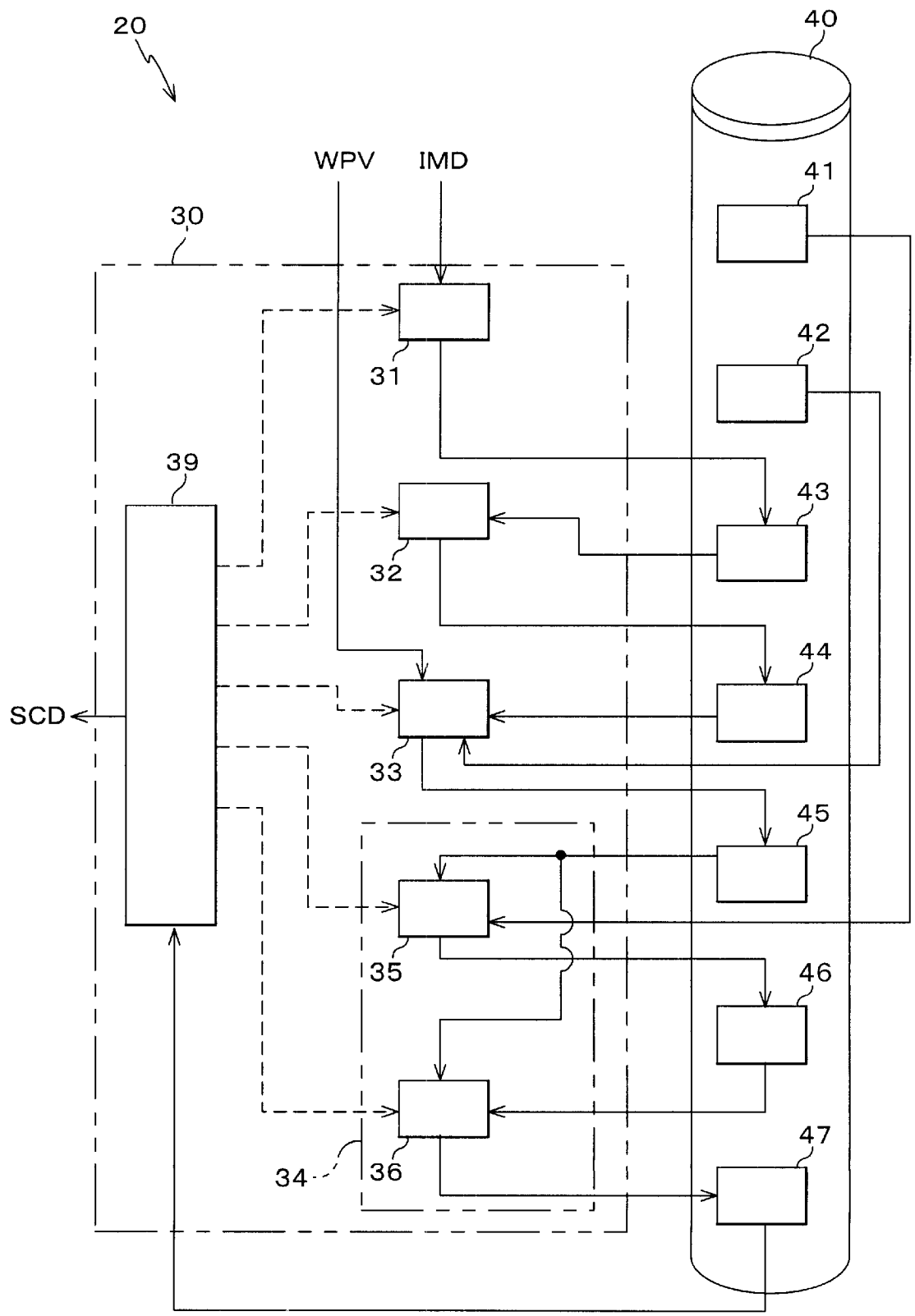
FIG. 5 is a view showing the schematic arrangement of a main control system.

As shown in FIG. 5, the main controller system 20 comprises the main controller 30 and the storage unit 40.

The main controller 30 comprises: the control unit 39 for controlling the movement of exposure apparatus 100 by transmitting the stage control data SCD to the stage control system 19; the image pick-up data collecting unit 31 for collecting the image pick-up data from the alignment system AS; the differential operating unit 32 as the waveform modifying unit for obtaining the differential waveform of 1 to P order (for example, P=2) differential waveform of the raw waveform in the image pick-up data collected by the image pick-up data collecting unit 31; the estimation position calculating unit 33 as the mark information calculating unit for obtaining the estimation position mark related to the position of the respective waveform; and the position operation system for obtaining the position of the alignment marks MX and MY based on the estimation mark position. The position operation apparatus 34 comprises: the weight calculating unit 35 for calculating the weight of the respective estimation mark position, based on the reference mark position and the estimation mark position of the respective waveform; and the position calculating unit 36 for calculating the positions of the alignment marks MX and MY, based on the weight information obtained by using the weight calculating unit 35 and the estimation mark positions of the waveforms.

The storage unit 40 comprises the followings in its inside: the template waveform storage area 41 for storing the waveform data of the raw waveform and the differential waveform; the reference mark position storage area 42 for storing the reference X-position data $DX_R$ (R=1 to QX) for the alignment mark MX ($i_R$, $j_R$) of which number is QX (>P+1) previously obtained, and the reference Y-position data $DY_R$ (T=1 to QY) for the alignment mark MY ($i_T$, $j_T$) of which number is QY (>P+1) previously obtained; the image pick-up data storage area 43; the differential waveform storage area 44; the estimated position storage area 45; the weight storage area 46; and the mark position storage area 47. In FIG. 5, allows drawn with the solid line show the data flow, and allows drawn with the dotted line show the control flow. Operation of each unit included in the main control system 20 is explained in the latter part.

In the present embodiment, the main controller 30 is structured in combination of the various units. However, the main controller 30 might be structured as a computer system, and the function of each unit composing the main controller 30 is achieved by the installed program in the main controller 30.

When the main controller 30 is structured as the computer system, it is not necessary to install all programs to achieve the function of the above-mentioned apparatus which structure the main controller 30 and the function of them are explained in below. For example, the following structure might be employed: a recording medium 91 in which the program is stored is prepared, it is shown in FIG. 1 as a box with the dotted lines; the medium 91 is inserted into and taken out from the reader unit 90, which is used to read out the contents of the program stored in the medium 91; the reader unit 90 is connected to the main control system 20 to read out the contents of the program (for example, that for executing the process shown in FIG. 5) from the medium 91 inserted into the reader unit 90 to execute the program.

Additional structure may be employed such that the main control system 20 reads out the contents of the program from the media 91 which is inserted into the reader unit 90 to install them in the system 20. Furthermore, another structure may be employed to install the contents of the program necessary for achieving the function in the main controller 20 via the communication network by using the internet or the like.

As the recording medium 91, various kinds of media might be used in which storing of information are varied magnetically (a magnetic disk, magnetic tape, or the like), electrically (PROM, RAM with buttery back up, EEPROM and other semiconductor memories), magneto-optically (magneto-optical disk or the like), electro-magnetically (digital-audio tape (DAT) or the like).

As mentioned above, the contents of the program used in below is easily amended, or version up for advancing its performance is also easily carried out, by structuring the system so that use the recording medium in which the contents of the program for achieving the desirable function or install them.

Back to FIG. 1, the illumination optical system 13 and the multi focal detection system with oblique incident light method are fixed on the support for supporting the projection optical system PL (not shown in Figs.). The illumination optical system 13 provides the luminous flux for image pick-up for forming multiple slit images to the best image plane of the projection optical system PL from the oblique direction against the optical axis AX. The multi focal detection system comprises the acceptance optical system 14 for accepting the reflection luminous flux of that of the image formation on the surface of the wafer W through the respective slit. As such multi focal detection system (13, 14), for example, the similarly structured system as disclosed in, for example, Japan laid-open No. H6-283403 and its corresponding U.S. Pat. No. 5,448,332. The disclosure described in the above is fully incorporated by reference herein. The stage control system 19 drives the wafer holder 25 in Z-direction and the tilt direction based on the wafer positional information from the multi focal detection system (13, 14).

In exposure apparatus 100 structured as described above, the arrangement coordinate system of the shot area on the wafer W is detected in below. The arrangement coordinate system is detected, premising that the marks MX (i, j) and MY (i, j) are previously formed on the wafer in the former layer forming process (for example, the first layer forming process); the wafer W is loaded on the wafer holder 25 by using the wafer loader which is not shown; and the positioning with rough accuracy, pre-alignment is already performed, in which the wafer W is moved through the stage control system 19 by using the main control system 20 to catch the respective mark MX (i, j) and MY (i, j) in the observation field of the alignment system AS. The pre-alignment is performed through the stage control system 19 by using the main control system 20, more precisely main control unit 39, based on the observation for the outer shape of the wafer, the observation result for the marks MX (i, j) and MY (i, j) in the large field, and the positional information (or velocity information) from the wafer interferometer 18. Furthermore, X-alignment mark MX ($i_m$, $j_m$) (m=1 to M; M in neither less than 3 nor QX) and Y-alignment mark MY ($i_n$, $j_n$) (n=1 to N; N in neither less than 3 nor QY), which are measured for detecting the arrangement coordinate system of the shot area are previously chosen. At that time, X-alignment marks are not arranged in a straight line from the viewpoint of design and the number is not less than three; and Y-alignment marks are neither arranged in the straight line, nor the number is less than three. However, the total number of the chosen marks (=M+N) must not be less than five.

The reference X-position data $DX_1$ to $DX_{QX}$ for the mark MX ($i_1$, $j_1$) to MX ($i_{QX}$, $j_{QX}$) in the X-alignment mark MX ($i_m$, $j_m$) and the reference Y-position data $DY_1$ to $DY_{QY}$ for the mark MY ($i_1$, $j_1$) to MY ($i_n$, $j_n$) in the Y-alignment mark MY ($i_{QY}$, $j_{QY}$) are previously stored in the reference mark position storage area 42. As the reference X-position data $DX_1$ to $DX_{QX}$ and the reference Y-position data $DY_1$ to $DY_{QY}$, values previously obtained from the other measurement or those obtained from the calculation based on the data of design might be used.

Alternatively, the following template waveforms are previously stored in the template waveform storage area 41: the template waveform XT (X) for the raw waveform of the image pick-up result of the X-alignment mark MX (to be described also as "XT(X)", hereinafter), the template waveform $d((XT(X)/dX, \ldots, d^P(XT(X)/dX^P$ ((to be described also as "$XT^{(1)}$ (X), $\ldots$ , $XT^{(P)}$ (X)", hereinafter), the template waveform YT (Y) for the raw waveform of the image pick-up result of the Y-alignment mark, and the template waveform $d((YT(Y)/dY, \ldots, d^P(YT(Y)/dY^P$ ((to be described also as "$YT^{(1)}$ (Y), $\ldots$ , $YT^{(P)}$ (Y)", hereinafter). In the present embodiment, the template waveform $XT^{(0)}$ (X)–XT(X), $YT^{(0)}$ (Y)–YT (Y) is obtained previously by using the value of the design, instead of the value of the design, the value is obtained as incorporating the mark image pick-up result by then into the value of design.

Figure 6:
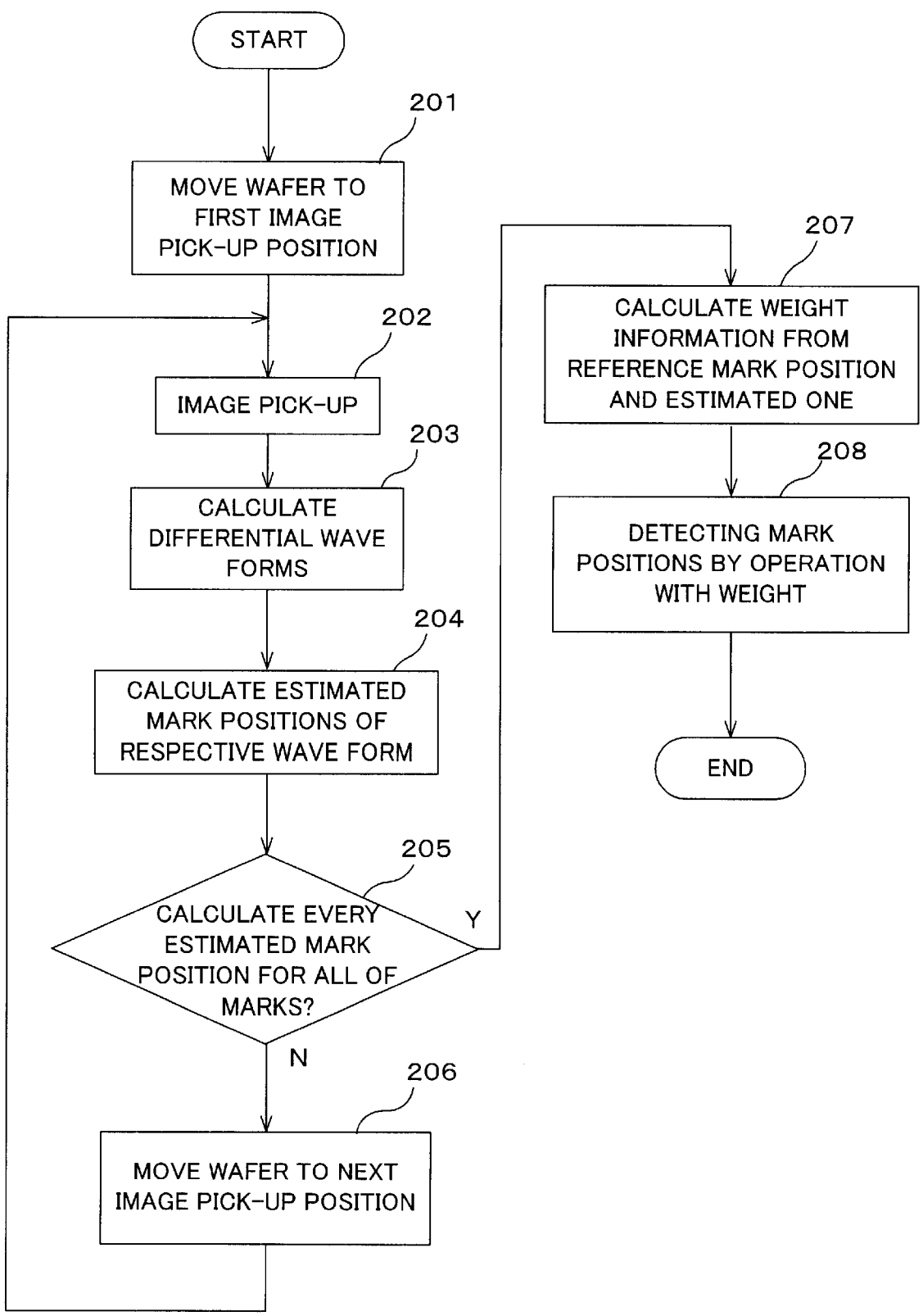
FIG. 6 is a flow chart for explaining a position detecting operation of the mark.

The detection of the arrangement coordinate system of the shot area on the wafer is explained according to the flow chart shown in FIG. 6, referring to other figures suitably.

First of all, in step 201 of the FIG. 6, the wafer W is moved so that the first mark (which is shown as X-alignment mark MX ($i_1$, $j_1$)) in the chosen marks MX ($i_m$, $j_m$) and MY ($i_n$, $j_n$) is set to the image pick-up position for the alignment system AS. The movement of the wafer W is performed under the control through the stage control system 19 by using the main control system 20.

Subsequently, in step 202, alignment system AS picks up the image of the mark MX ($i_1$, $j_1$) under the control of the control unit 39. As described above, the image pick-up data collecting unit 31 incorporates the image pick-up data IMD, which is the image pick-up result derived from the alignment system AS, depending on the instruction from the control unit 39 to transmit them to the image pick-up data storage area 43 to collect the image pick-up data IMD.

Then, in step 203, the differential operating unit 32 reads out the image pick-up data IMD from the image pick-up data storage area 43 under the control of the control unit 39. The differential operating unit 32 extracts the distribution of the signal intensity (light intensity distribution) in the X-direction $I_1(X)$ to $I_{50}(X)$ on the plural scanning line (for example, fifty lines) for the center of the image pick-up data IMD in Y-direction at the mark MX ($i_1$, $j_1$) in the picked-up image. The average waveform of the signal intensity in the X-direction, i.e., the raw waveform I(X) (to be referred to as "$I^{(0)}$ (X)", hereinafter) is obtained.

$$I^{(0)}(X) = \left[\sum_{k=1}^{50} I_k(X)\right] / 50 \qquad (1)$$

Figure 7A:
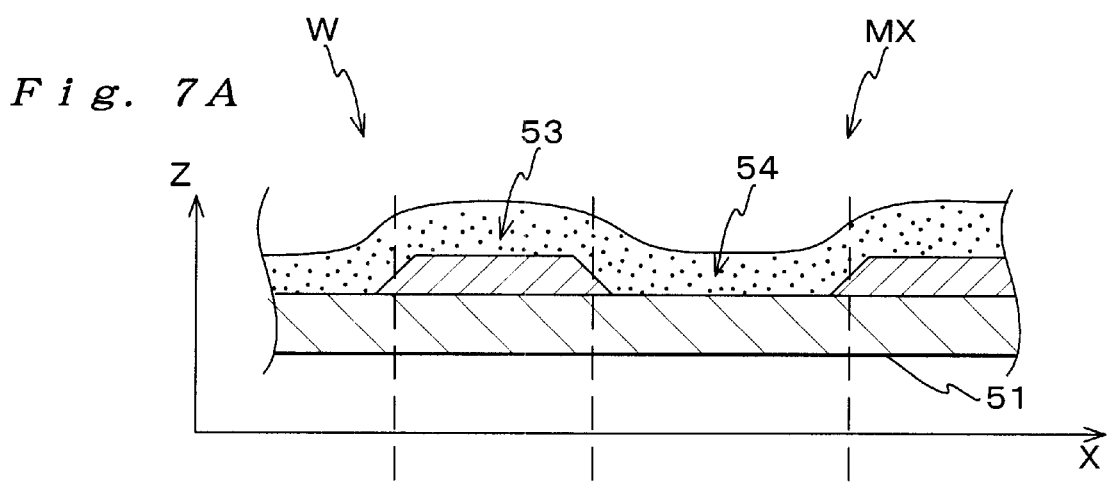
FIG. 7A to FIG. 7D are views for explaining image pick-up results of the positioning mark of an embodiment of the present invention.
Figure 7B:

In the raw waveform $I^{(0)}$ (X) thus obtained, the high frequency noise, which is overlapped on each signal intensity distribution $I_1(X)$ to $I_{50}(X)$, is decreased. The obtained raw waveform $I^{(0)}$ (X) is shown in FIG. 7B.

Figure 7C:
Figure 7D:
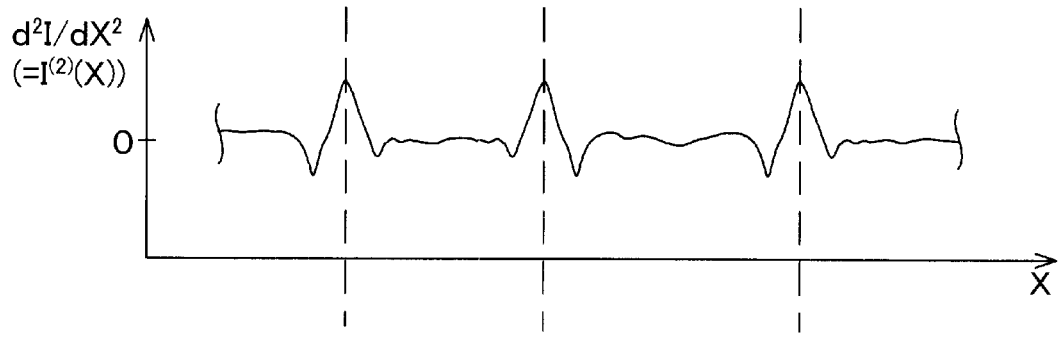

Subsequently, the differential operating unit 32 conducts the differential as the process to modify the raw waveform $I^{(0)}$ (X) and calculates the differential waveform dI (X)/dX, $\ldots$ , $d^P I(X)/d^P X$ (to be also described as "$I^{(1)}$ (X), $\ldots$ , $I^{(P)}$ (X)") as the modified waveform. The figure of the modified waveform is different from the raw waveform $I^{(0)}$ (X) (for example, the signal intensity figure or the like) as shown in FIG. 7C and FIG. 7D. The first order differential waveform $I^{(1)}$ (X) and the second order differential waveform $I^{(2)}$ (X) among thus obtained differential waveform are representatively in FIG. 7C and FIG. 7D.

After that, the differential operating unit 32 stores the raw waveform $I^{(0)}$ (X) and the differential waveform $I^{(1)}$ (X) to $I^{(P)}$ (X) in the differential waveform storage area 44.

Then, in step 204, under the control of the control unit 39, the estimated position calculating unit 33 performs template matching for the waveform $I^{(p)}$ (X) (p=0 to P) by using the respective template waveform $XT^{(p)}$ (X), and calculates the estimated X position $X_1$ of the mark MX $(i_1, j_1)$ which is obtained respective waveform $I^{(p)}$ (X). In the described below, the estimated X-position and the estimated Y-position explained later are generally called as the "estimated mark position".

In order to calculate the estimated X-position, the correlation coefficient $CR_P(\delta X)$ between the waveform $I^{(p)}$ (X) and the template waveform $XT^{(p)}$ (X+δX) is obtained, and the parameter δX for maximizing the coefficient is then obtained. The correlation coefficient $CR_P(\delta X)$ is obtained for the predetermined definition area XD of the X-position by using the following equation (2), wherein the average of the waveform $I^{(p)}$ (X) is $\mu_p$ and the average of the template waveform $XT^{(p)}$ (X) is $\mu T_p$.

$$CR_p(\delta X) = \frac{\left[\sum_{XD}((I^{(p)}(X)-\mu_p)\cdot(XT^{(p)}(X+\delta X)-\mu T_p))\right]}{\left[\sum_{XD}((I^{(p)}(X)-\mu_p)^2\cdot(XT^{(p)}(X+\delta X)-\mu T_p)^2)\right]^{1/2}} \quad (2)$$

The predetermined definition area XD might be entire area in the X-direction of the mark MX($i_1, j_1$) (to be referred to as the "entire area template matching", hereinafter), or might be every partial area in X-direction in which the large peak exists in the differential waveform (to be referred to as the "partial area template matching", hereinafter), when the template matching of the differential waveform is conducted. In the entire template matching, the estimated X-position $X_1$ is directly obtained from the value δX for maximizing the correlation coefficient $CR_p$ (δX) and the positional information of the wafer W (WPV) described above. Alternatively, in the partial template matching, respective edge position of the mark MX($i_1, j_1$) is obtained from the value δX for maximizing the correlation coefficient $CR_p$ (δX) and the positional information of the wafer W (WPV) described above to obtain the estimated X-position $X_1$ for the mark MX($i_1, j_1$). In the partial template matching, there is no effect caused by the noise overlapping in the area except the definition area, and the biased result around the point of fluctuation is obtained. Therefore, since the value biased around the true point of fluctuation is obtained, the true point of fluctuation of X-position is precisely obtained.

Thus obtained the estimated position $X_1$ for each waveform $I^{(P)}$ (X) is stored by the estimated position calculating unit 32 in the estimated position storage area 45.

Then, in step 205, it is decided whether the calculation of the estimated positions derived from the raw waveform and differential waveform for all of the marks chosen is completed or not. Up to the above-mentioned procedure, the calculation of the estimated positions for the sole mark MX $(i_1, j_1)$, i.e., the estimated X-position mark MX $(i_1, j_1)$ is completed. Therefore, the decision made in step 205 is negative, the process is moved to step 206.

In step 206, the control unit 39 controls to move the wafer W to the position so that the wafer is in the image pick-up field of the alignment system AS. The control unit 39 controls to move the wafer stage WST to convey the wafer W by controlling the wafer driving unit 24 through the stage control system 19.

Hereinafter, in step 205, the estimated X-position $X_n^{(p)}$ (p=0 to P) of the mark MX $(i_m, j_m)$ (m=2 to M) and the estimated Y-position $Y_n^{(p)}$ (p=0 to P) of the mark MY $(i_n, j_n)$ (n=1 to N) are calculated in the same manner as those in the above-mentioned mark MX $(i_1, j_1)$, until it is decided that the estimated mark positions for all of the marks are calculated and then calculation is finished. Thus the estimated mark position for all of the marks chosen are calculated to obtain the positional information, and the positional information is storing the positional information storage area 43. Then, when the positive decision is made, the process is moved to step 207.

In step 207, the weight calculating unit 35 calculates the weight $WX^{(p)}$ and $WY^{(p)}$ (p=0 to P) as described in below. The weight WX is for the estimated X-position obtained from the raw waveform and the differential waveform in every mark MX $(i_m, j_m)$ (m=1 to M). The weight $WY^{(p)}$ for the estimated Y-position is obtained from the raw waveform and the differential waveform in every mark MY $(i_n, j_n)$ (n=1 to N).

First of all, the X-position $X_R$ (R=1 to QX) for the mark MX($i_1, j_1$) to MX($i_{QX}, j_{QX}$) is represented with Equation (3) by using the weight calculating unit 35 according to the weight $WX^{(p)}$ which is still unknown.

$$X_R = \sum_{p=0}^{P} WX^{(p)} \cdot X_R^{(p)} \quad (3)$$

Subsequently, the weight calculating unit obtains the fluctuation SX that shows the distribution of the X-position $X_R$ to the reference X-position $DX_R$ read out from the reference mark storage area 42 according to Equation (4). At that time, the weight $WX^{(p)}$ is still unknown.

$$SX = \sum_{R=1}^{QX} (X_R - DX_R)^2 \quad (4)$$

The weight calculating unit 35 obtains the weight $WX^{(p)}$ to minimize the distribution SX. Practically, Equation is partial differentiated by the each weight $WX^{(p)}$, and the linear equation derived from the result of each partial differentiate =0 is solved to obtain the most suitable weight $WX^{(p)}$ respectively.

Subsequently, the weight $WY^{(p)}$ for the estimation Y-position is obtained in the same manner that in the above-mentioned weight $WX^{(p)}$. The weight $WY^{(p)}$ is obtained from the raw waveform and the differential waveform of the mark MY $(i_n, j_n)$ (n=1 to N). That is, the weight $WY^{(p)}$ to minimize the distribution SY is obtained. The weight $WY^{(p)}$ shows the distribution of the Y-position $Y_T$ (T=1 to QY) of the respective mark MY $(i_1, j_1)$ to MY $(i_{QY}, j_{QY})$ to the reference Y-position $DY_T$ calculated from the weighted calculating operation.

Thus obtained weight $WX^{(p)}$ and $WY^{(p)}$ are stored by the weight calculating unit 35 in the weight information area 46.

Then, in step 208, the position calculating unit 36 reads out the estimation X-position $X_m^{(p)}$ (p=0 to P) of the mark MX $(i_m, j_m)$ (m=1 to M) and the estimation Y-position $X_n^{(p)}$ (p=0 to P) of the mark MY $(i_n, j_n)$ (n=1 to N) from the estimation position storage area 45, as well as reads out weight $WX^{(p)}$ and $WY^{(p)}$ from the weight storage area 46. Subsequently, the position calculating unit 36 calculates the X-position $X_m$ of the mark MX $(i_m, j_m)$ by using the weight $WX^{(p)}$ that is not unknown and the estimation X-position $X_m^{(p)}$, according to Equation (3). It calculates the Y-position $Y_n$ of the mark MY $(i_n, j_n)$ as the same manner as described above by using the weight $WY^{(p)}$ and the estimation Y-position $Y_n^{(p)}$. The position calculating unit 36 stores the X-position Xm of the mark MX $(i_m, j_m)$ and the Y-position Yn of the mark MY $(i_n, j_n)$ in the mark position storage area 47.

As described above, the detection of the X-position $X_m$ of the mark MX $(i_m, j_m)$ and the Y-position $Y_n$ of the mark MY $(i_n, j_n)$ is finished.

After that, the control unit 39 reads out the X-position $X_m$ of the mark MX $(i_m, j_m)$ (m=1 to M) and the Y-position $Y_n$ of the mark MY $(i_n, j_n)$ (n=1 to N) from the mark position storage area 47, and parameter value (error parameter) to calculate the arrangement coordinate system of the shot area SA on the wafer W by using the statistical operation disclosed in the Japanese laid-open publication S61-44429 and its corresponding U.S. Pat. No. 4,780,617. The disclosure described in the above is fully incorporated by reference herein. Under the control of control unit 39, the wafer W and the reticle R are moved in reverse direction along the scanning direction (Y-direction) with the velocity ratio corresponding to the projection ratio. The shot area arrangement obtained from parameter value calculated is used and the illumination area with slit shape on the reticle R (the center of the illumination area is coincident with the optical axis AX) is illuminated with the illumination light IL. According to this, the pattern of the pattern area on the reticle R is transferred onto the shot area on the wafer W in reduced magnification.

As described above, in the present embodiment, the position of the alignment marks MX and MY are precisely detected by using the raw waveform of the image pick-up signal and the differential waveform that is obtained by the modification process to the raw waveform. This detection is performed according to the form of the noise superposed on the image pick-up signal of the alignment mark MX and MY formed on the wafer W. In the present embodiment, the arrangement coordinate of the shot area SA (i, j) on the wafer W is precisely calculated based on the positions of the alignment mark MX and MY which are precisely obtained respectively. Then the pattern formed on the reticle R is precisely transferred onto the respective shot area SA (i, j).

The above described weight $WX^{(p)}$ and $WY^{(p)}$ are obtained, for example, for the first wafer of the exposure lot. For the other wafer in the same exposure lot, the position detection of the alignment mark might be performed by applying the same weight $WX^{(p)}$ and $WY^{(p)}$ as those in the first wafer. Alternatively, even through the exposure lot is different, the same weight $WX^{(p)}$ and $WY^{(p)}$ of the wafer that is modified by the same process might be applied. Furthermore, the $WX^{(p)}$ and $WY^{(p)}$ of the several wafer from the initial in the same lot or wafers produced in the same process, and the average of these might be applied on the other wafer in the same lot, or those produced in the same process are obtained as the weight.

In the present embodiment, the estimated mark position obtained from the every waveform of the raw or differential waveform is weighed properly, and the positions of the alignment marks MX and MY by using the weighted calculating operation. Therefore, the positions of the alignment marks MX and MY might be precisely detected in spite of the noise form superposed on the image pick-up signal.

In the present embodiment, the weight of the estimation mark position obtained from the every waveform is obtained based on the position of the estimation mark obtained and that of the reference mark. Accordingly, the weighted calculating operation by proper weighing might be performed, and the positions of the alignment mark MX and MY are precisely detected.

The respective position of the estimation mark for the waveform is obtained by using the template matching. Accordingly, the position of the estimation mark is obtained with high estimation reliability, and the positions of the alignment mark MX and MY are precisely detected.

In the present embodiment, the every weight of the position of the estimation mark for using in the weighted calculating operation is statistically obtained based on the number of the position of the reference mark for the alignment marks MX and MY, wherein the number is larger than those for the position of the estimation mark obtained from the every alignment mark MX and MY. Accordingly, the respective weight of position of the estimation mark is precisely obtained by using the positional information of the estimation mark obtained.

In the above-mentioned embodiment, the differential waveform is used as that modified to the raw waveform. However, the present invention is not limited to it. As the modification processing for the raw waveform, for example, filtering processing (which is for changing the frequency component of the raw waveform) might be used besides the differentiation of the raw waveform. As the filtering processing, there can be mentioned, for example, the known low pass filtering or high pass filtering, other filtering in which the predetermined filtering function such as SYNC function is used. Alternatively, the manner of the filtering is not limited, and it varies.

In brief, any modification can be performed if the modified waveform of which waveform shape is different from the raw waveform can be obtained. The number of the modified waveform is not limited to one. For example, in the above-mentioned embodiment, two modified waveforms, the first and the second order differential ones, are obtained as the modified one. The positional information of the mark is obtained in every waveform including the raw waveform. Then, the positional information of the mark might be obtained from the operation processing by using the procedure of the operation with the weight as mentioned above.

In the operation processing, any modified waveform might be used. For example, the operation processing might be used by using the positional information of the mark and that obtained from the first order differential waveform. Alternatively, the operation processing might be used by using the positional information of the mark and that obtained from the second order differential waveform. Furthermore, the other operation might be performed by using the positional information of the mark and that obtained from the waveform which is modified by processing other than differentiation, for example, low pass filtering.

In the above-mentioned embodiment, the weights of the estimation mark positions used for the operation with weight are obtained based on the larger number of the reference mark positions for the alignment mark MX and MY than those for the estimation mark position for the alignment marks MX and MY. However, those numbers of the marks might be the same. In this case, the weight of the respective estimation mark position can be obtained directly, by solving the above-mentioned Equation 3 as the simultaneous equation.

In the embodiment as described above, the positions of the alignment marks MX and MY are detected by using the all of the estimation mark position obtained for the alignment marks MX and MY. However, for the detection, some of the estimated mark positions are chosen from those obtained. As the method for choosing those mark position, there can be mentioned, for example, the method in which the mark has the lower difference between the estimation mark position and the corresponding reference mark position then the predetermined value. As the method for choosing the estimation mark position, for example, the method, in which one of the waveform to be used is chosen among the raw and the differential waveform, might be employed. The waveform to be used is estimated that the estimated mark position obtained is the closest to the reference one, in the result that the positions of the estimated mark position obtained is compared to the reference mark position.

Furthermore, the positions of the alignment mark MX and MY can be detected by using the sole waveform to obtain the estimation mark position with small noise effect, when the manner of the noise overlapped on the raw waveform is known to some extent. When the differential waveform is used, it has the form having emphasized edge portion at which the signal level is greatly changed in the raw waveform. Therefore, it is desirable to detect the respective edge position by using the partial template matching as mentioned above to detect the positions of the alignment marks MX and MY based on the edge position. Accordingly, the position detection with reduced low frequency noise effect can be performed.

The present invention may apply on any type of the wafer exposure apparatus or liquid crystal exposure apparatus or the like, for example, the reduced projection exposure apparatus of which light source is ultraviolet and soft X-ray with its wave length about 30 nm, X-ray exposure apparatus of which light source is X-ray with its wave length 1 nm, EB (electron beam) or ion beam exposure apparatus. Furthermore, the present invention may apply on both step-and-repeat machine and step-and-scan machine.

In the above-mentioned embodiment, the position detection of the position mark formed on the wafer and the positioning of the wafer in exposure apparatus are explained. However, the position detection and positioning in which the present invention is applied might be employed for the position detection of the positioning mark formed on the reticle, or positioning of the reticle. Furthermore, the position detection and positioning are applicable to the apparatus except exposure apparatus, for example, the observation apparatus for the substance by using the microscope or the like, the positioning apparatus for the object in the assembly line, the modification line, or inspection line in the factory.

<Device manufacturing>

An embodiment of a device manufacturing method using the exposure apparatus and method above will be described.

Figure 8:
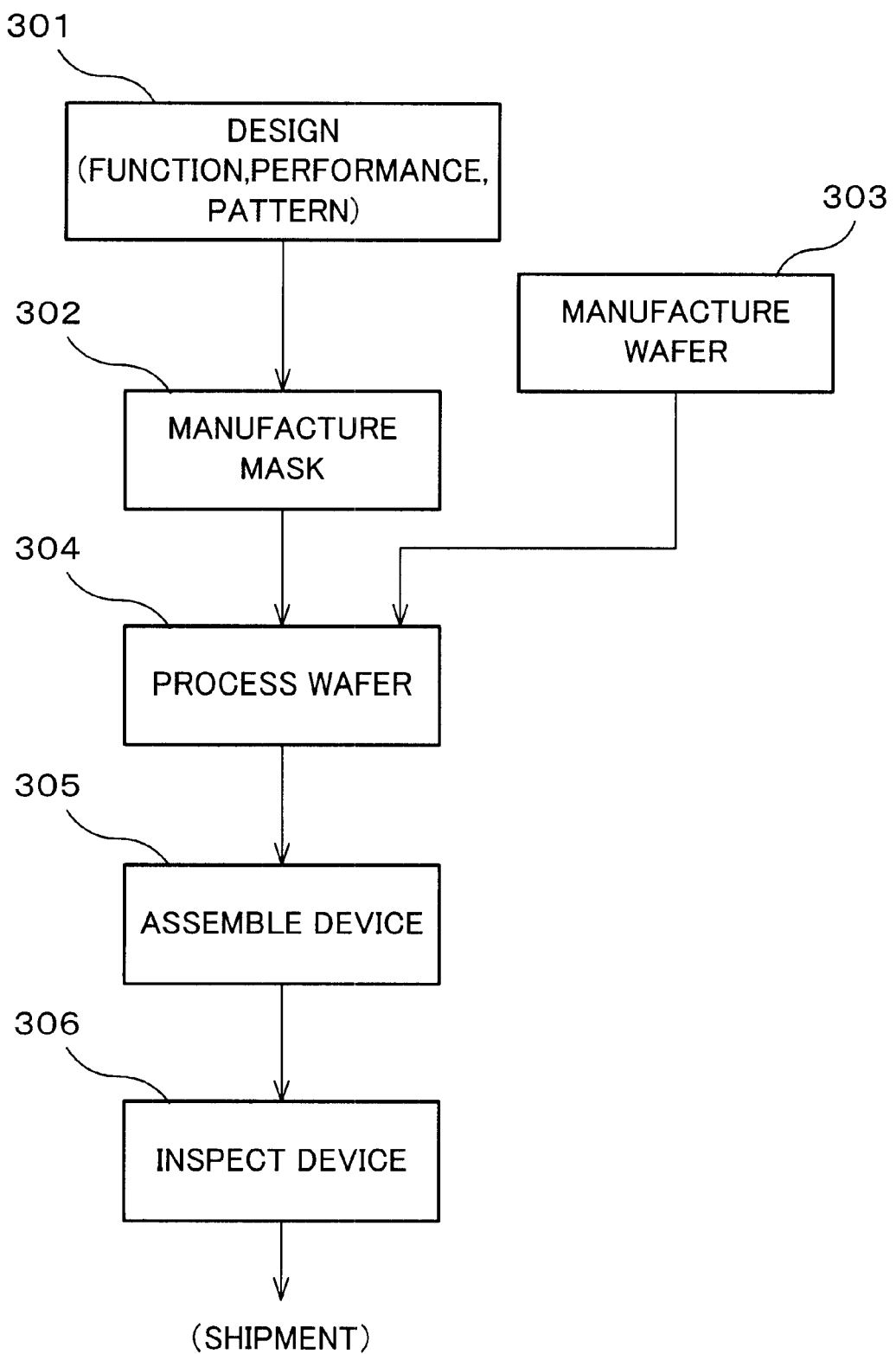
FIG. 8 is a flow chart for explaining the device manufacturing method by using the exposure apparatus shown in FIG. 1.

FIG. 8 is a flow chart showing an example of manufacturing a device (a semiconductor chip such as an IC, or LSI, a liquid crystal panel, a CCD, a thin film magnetic head, a micromachine, or the like). As shown in FIG. 8, in step 301 (design step), function/performance is designed for a device (e.g., circuit design for a semi conductor device) and a pattern to implement the function is designed. In step 302 (mask manufacturing step), a mask on which the designed circuit pattern is formed is manufactured. In step 303 (wafer manufacturing step), a wafer W is manufacturing by using a silicon substance or the like.

In step 304 (wafer processing step), an actual circuit and the like are formed on the wafer W by lithography or the like using the mask and wafer prepared in steps 301 to 303, as will be described later. In step 305 (device assembly step), a device is assembled by using the wafer processed in step 304. Step 305 includes process such as dicing, bonding and packaging (chip encapsulation).

Finally, in step 306 (inspection step), a test on the operation of the device, durability test, and the like are performed. After these steps, the device is completed and shipped out.

Figure 9:
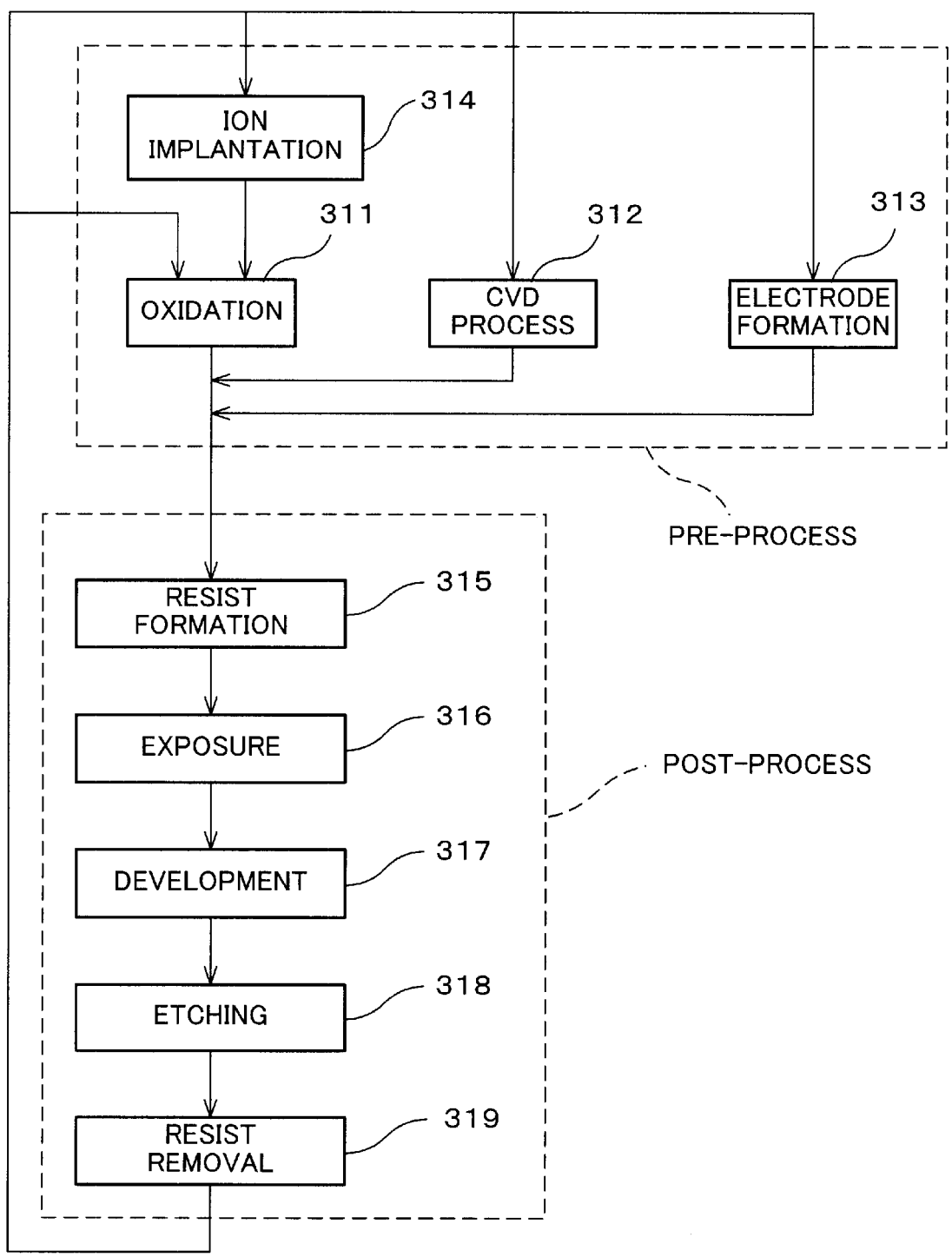
FIG. 9 is a flow chart showing the processing in a wafer processing step in FIG. 8.

FIG. 9 is a flow chart showing a detailed example of step 304 described above in manufacturing the semiconductor device. Referring to FIG. 9, in step 311 (oxidation step), the surface of the wafer is oxidized. In step 312 (CVD step), an insulating film is formed on the wafer surface. In step 313 (electrode formation step), an electrode is formed on the wafer by vapor deposition. In step 314 (ion implantation step), ions are implanted into the wafer. Steps 311 to 314 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 315 (resist formation step), the wafer is coated with a photosensitive agent. Next as, in step 316, the circuit pattern on the mask is transcribed onto the wafer by the above exposure apparatus and method. Then, in step 317 (developing step), the exposed wafer is developed. In step 318 (etching step), and exposed member on a portion other than a portion where the resist is left is removed by etching. Finally, in step 319 (resist removing step), the unnecessary resist after the etching is removed.

By repeatedly performing these pre-process and post-process, multiple circuit patterns are formed on the wafer.

While the above-described embodiments of the present invention are the presently preferred embodiments thereof, those skilled in the art of lithography system will readily recognize that numerous additions, modifications and substitutions may be made to the above-described embodiments without departing from the spirit and scope thereof. It is intended that all such modifications, additions and substitutions fall within the scope of the present invention, which is best defined by the claims appended below.

What is claimed is:

1. A position detecting method for detecting a position information of a mark formed on an object, comprising:

performing an image pick-up of the mark;

obtaining a predetermined order differential waveform of a signal waveform, which is obtained by said performing the image pick-up; and detecting said position information of the mark, based on a correlation between a predetermined template waveform and a portion of said differential waveform having signal levels within a predetermined range.

2. The position detecting method according to claim 1, wherein said detecting the position information of the mark comprising:

obtaining a correlation coefficient between said differential waveform and said template waveform at a respective relative position while the relative positional relation between the differential waveform and the template waveform is changing; and detecting said position information of the mark based on the relative positional relation at which a correlation coefficient is maximum.

3. A position detecting method for detecting a position information of a mark formed on an object, comprising:

performing an image pick-up of the mark;

performing a predetermined modification processing to a signal waveform which is obtained by the image pick-up to obtain at least one of a modified waveform;

obtaining respective mark information with respect to a position of said mark based on the respective signal waveform and the modified waveform; and detecting said position information of said mark based on a plurality of the mark information out of the obtained mark information.

4. The position detecting method according to claim 3, wherein said modified waveform has different signal intensity distribution from those of said signal waveform.

5. The position detecting method according to claim 3, wherein said predetermined modification processing includes performing to change a distribution of frequency components of said signal waveform.

6. The position detecting method according to claim 3, wherein said predetermined modification processing includes obtaining at least predetermined order differential waveform of said signal waveform.

7. The position detecting method according to claim 6, wherein said predetermined modification processing includes obtaining a plurality order of differential waveforms up to said predetermined order.

8. The position detecting method according to claim 3, wherein said position information of said mark is detected by using a weighted calculating operation of the plurality of mark information, in said detection for the position information of the mark.

9. The position detecting method according to claim 8, wherein respective weight of a plurality of mark information used in said weighted calculating operation is obtained based on the plurality of the mark information and a reference mark information previously obtained.

10. The position detecting method according to claim 9, wherein all of said signal waveform and modified waveform are used as the waveform for position detection to obtain the position information of said mark, in said detection for the position information of the mark.

11. The position detecting method according to claim 9, wherein weights of a plurality of said mark information is obtained based on the same number of said reference mark information as those of said waveform for position detection.

12. The position detecting method according to claim 9, wherein weights of a plurality of said mark information are statistically obtained based on the larger number of said reference mark information than those of said waveform for position detection.

13. The position detecting method according to claim 9, wherein a waveform, which is estimated that it is the closest mark information to said reference mark information, is used as the waveform for position detection, and said position of the mark is detected by using the estimated waveform for position detection, in detecting said position information of a mark.

14. The position detecting method according to claim 8, wherein obtaining said mark information comprising:

respectively obtaining correlation coefficients at a respective relative position, while said relative positional relation between said signal waveform and a template waveform for the signal waveform, and the relative positional relation between at least one of desirable modified waveform and the template waveform for the modified waveform in the modified ones are changing; and respectively obtaining estimated positions of the mark based on the relative positional relation at which the correlation coefficients are maximum, wherein the estimated positions of the mark are the mark information for signal waveform of the mark and at least one of desirable modified waveform in the modified ones.

15. The position detecting method according to claim 14, wherein all of said signal waveform and modified one are used as a waveform for position detection to obtain the position information of said mark, in a detection of said position information of the mark.

16. The position detecting method according to claim 14, wherein weights of a plurality of said mark are obtained based on the same number of a reference mark information as those of said waveform for position detection.

17. The position detecting method according to claim 14, wherein weights of a plurality of said mark information are statistically obtained based on the larger number of a reference mark information than those of said waveform for position detection.

18. The position detecting method according to claim 14, wherein a waveform, which is estimated that it becomes the closest mark information to said reference mark information is used as the waveform for a position detection, and said mark position is detected based on the estimated waveform for the position detection, in detecting said position information of said mark.

19. The position detecting apparatus which detects a position information of a mark formed on an object, comprising:

an image pick-up unit that performs an image pick-up on an area formed on the object;

a differentiation operation unit, which is electrically connected to the image pick-up unit, and which obtains a predetermined order differential waveform of a signal waveform of the mark obtained as a result of the image pick-up by the image pick-up unit; and a position operation unit, which is electrically connected to the differentiation operation unit, and which detects the position information of the mark, based on a correlation between a predetermined template waveform and a portion of said differential waveform having signal levels within a predetermined range.

20. The position detecting apparatus according to claim 19, wherein said position operation unit comprises a correlation coefficient calculating unit which obtains a correlation coefficient between said differential waveform and said template waveform at respective relative position, while relative positional relation between the differential waveform and said template waveform is changing; and a position calculating unit which is electrically connected to the correlation coefficient calculating unit, and which calculates the position information of the mark based on the relative positional relation at which the correlation coefficient is maximum.

21. A position detecting apparatus to detect a position information of a mark formed on an object, comprising:

an image pick-up unit which performs an image pick-up on the object;

a waveform modifying unit which is electrically connected to the image pick-up unit, and which performs a predetermined modification processing to a signal waveform obtained as a result of the image pick-up by the image pick-up unit to obtain a modified waveform; and a mark information calculating unit which is electrically connected to the waveform modifying unit, and which obtains respective mark information with respect to a position of the mark based on a signal waveform and the modified waveform obtained by said waveform modifying unit; and a position calculating unit, which is electrically connected to the mark information calculating unit, and which detects said position information of said mark based on a plurality of the mark information out of the mark information obtained by the mark information calculating unit.

22. The position detecting apparatus according to claim 21, wherein said waveform modifying unit comprises a frequency component changing unit which performs a processing to change a distribution of a frequency component of said signal waveform as said predetermined modification processing.

23. The position detecting apparatus according to claim 21, wherein said waveform modifying unit comprises a differentiation operating unit which obtains at least predetermined order differential waveform of said signal waveform as said predetermined modification processing.

24. The position detecting apparatus according to claim 23, wherein said differentiation operating unit obtains a plurality of order differential waveform up to said predetermined order.

25. The position detecting apparatus according to claim 21, wherein said position calculating unit detects said position information of said mark by using a weighted calculation of a plurality of the mark information.

26. The position detecting apparatus according to claim 25, wherein said position calculating unit comprises a weight calculating unit which obtains respective weight of a plurality of said mark information used in said weighted calculation based on a plurality of the mark information and a reference mark information previously obtained.

27. An exposure method to transfer a predetermined pattern onto a divided area on a substrate, comprising:

detecting a position information of a mark for position detection formed on the substrate by using the position detecting method according to claim 1, obtaining a predetermined number of parameter with respect to said predetermined divided area, and calculating an arrangement information of the divided area formed on the substrate; and transferring the pattern onto the divided area, while the position of the substrate is regulated based on the calculated arrangement information of the divided area.

28. An exposure method to transfer a predetermined pattern onto a divided area on a substrate, comprising:

detecting a position information of a mark for position detection formed on the substrate by using the method according to claim 3, obtaining a predetermined number of parameter for said predetermined divided area, and calculating an arrangement information of the divided area formed on the substrate; and transferring the pattern onto the divided area, while the position of the substrate is regulated based on the calculated arrangement information of the divided area.

29. An exposure apparatus which transfers a predetermined pattern onto a divided area on a substrate comprising:

a stage unit which moves the substrate along a movement plane; and a position detecting unit according to claim 19, which detects a position information of a mark formed on the substrate, loaded on the stage unit.

30. An exposure apparatus which transfers a predetermined pattern onto a divided area on a substrate, comprising:

a stage unit which moves the substrate along a movement plane; and a position detecting unit according to claim 21, which detects a position information of a mark formed on the substrate, loaded on the stage unit.

31. A computer readable recording medium containing data for a control program to be executed by a position detecting unit that detects a position information of a mark formed on an object, wherein the control program comprises controlling said position detecting unit to obtain a predetermined order differential waveform of a signal waveform which is obtained by the image pick-up of the mark; and controlling said position detecting unit to detect said position information of the mark, based on a correlation between a predetermined template waveform and a portion of said differential waveform having signal levels within a predetermined range.

32. A computer readable recording medium containing data for a control program to be executed by a position detecting unit that detects a position information of a mark formed on an object, wherein the control program comprises controlling said position detecting unit to perform the predetermined modification processing to a signal waveform which is obtained by said image pick-up of the mark to obtain at least one of modified waveform;

controlling said position detecting unit to obtain respective mark information of said position mark based on said signal waveform and at least one of modified waveform respectively; and controlling said position detecting unit to detect the position information of the mark based on a plurality of the mark information out of the obtained mark information.

33. A device manufacturing method including a lithographic process, comprising exposing the substrate using said exposure method according to claim 27 in said lithographic process.

34. A device manufacturing method including a lithographic process, comprising exposing the substrate using said exposure method according to claim 28 in said lithographic process.

35. A position detecting method for detecting position information of a mark formed on an object, said position detecting method comprising:

performing an image pick-up of said mark;

performing first modification processing on a signal waveform which is obtained by the image pick-up to obtain a first modified waveform;

performing second modification processing different from said first modification processing on said signal waveform to obtain a second modified waveform;

obtaining first mark information about a position of said mark based on said first modified waveform;

obtaining second mark information about a position of said mark based on said second modified waveform; and determining position information of said mark based on said first and second mark information.

36. The position detecting method according to claim 35, wherein said first modification processing is processing that obtains a first, predetermined order differential waveform of said signal waveform, and said second modification processing is processing that obtains a second, different order differential waveform of said signal waveform from said predetermined order.

37. The position detecting method according to claim 35, wherein said first modification processing is differential processing that obtains a predetermined order differential waveform of said signal waveform, and said second modification processing is different from said differential processing.

38. The position detecting method according to claim 35, wherein in the obtaining of first mark information, the first mark information is obtained based on a correlation between a first template waveform and said first modified waveform, and in the obtaining of second mark information, the second mark information is obtained based on a correlation between a second template waveform different from said first template waveform and said second modified waveform.

39. An exposure method to transfer a predetermined pattern onto a divided area on a substrate, comprising:

detecting a position information of a mark for position detection formed on the substrate by using the position detecting method according to claim 35, obtaining a predetermined number of parameter with respect to said predetermined divided area, and calculating an arrangement information of the divided area formed on the substrate; and transferring the pattern onto the divided area, while the position of the substrate is regulated based on the calculated arrangement information of the divided area.

40. A device manufacturing method including a lithographic process, comprising:

exposing the substrate using said exposure method according to claim 39 in said lithographic process.

41. A position detecting unit which detects position information of a mark formed on an object, said position detecting unit comprising:

an image pickup unit that performs an image pick-up of said mark;

a first modifying unit which is electrically connected to said image pickup unit and performs first modification processing on a signal waveform that is a picking-up result of said image pickup unit to obtain a first modified waveform;

a second modifying unit which is electrically connected to said image pickup unit and performs second modification processing different from said first modification processing on said signal waveform that is a picking-up result of said image pickup unit to obtain a second modified waveform;

a first operation unit which is electrically connected to said first modifying unit and obtains first mark information about a position of said mark based on said first modified waveform;

a second operation unit which is electrically connected to said second modifying unit and obtains second mark information about a position of said mark based on said second modified waveform; and a position operation unit which determines position information of said mark based on said first and second mark information.

42. The position detecting unit according to claim 41, wherein said first modification processing is differential processing that obtains a first, predetermined order differential waveform of said signal waveform, and said second modification processing is one of differential processing that obtains a second, different order differential waveform of said signal waveform from said predetermined order and different processing from said differential processing.

43. The position detecting unit according to claim 41, wherein said first operation unit obtains the first mark information based on a correlation between a first template waveform and said first modified waveform, and said second operation unit obtains the second mark information based on a correlation between a second template waveform different from said first template waveform and said second modified waveform.

44. An exposure apparatus which transfers a predetermined pattern onto a divided area on a substrate, comprising:

a stage unit which moves the substrate along a movement plane; and a position detecting unit according to claim 41, which detects a position information of a mark formed on the substrate, loaded on the stage unit.

45. A computer readable storage medium containing a control program to be executed by a position detecting unit that detects position information of a mark formed on an object, said control program comprising:

controlling said position detecting unit to perform first modification processing on a signal waveform which is obtained by picking up an image of said mark to obtain a first modified waveform;

controlling said position detecting unit to perform second modification processing different from said first modification processing on said signal waveform to obtain a second modified waveform;

controlling said position detecting unit to obtain first mark information about a position of said mark based on said first modified waveform;

controlling said position detecting unit to obtain second mark information about a position of said mark based on said second modified waveform; and controlling said position detecting unit to determine position information of said mark based on said first and second mark information.

* * * * *